United States Patent [19]
Hill et al.

[11] Patent Number: 6,141,779
[45] Date of Patent: Oct. 31, 2000

[54] METHOD FOR AUTOMATICALLY PROGRAMMING A REDUNDANCY MAP FOR A REDUNDANT CIRCUIT

[75] Inventors: J. Michael Hill; Jay E. Fleischman, both of Fort Collins, Colo.

[73] Assignee: Hewlett-Packard Company, Palo Alto, Calif.

[21] Appl. No.: 09/175,032

[22] Filed: Oct. 19, 1998

[51] Int. Cl.[7] .................................................. G11C 29/00
[52] U.S. Cl. .......................................... 714/710; 365/200
[58] Field of Search .................................... 714/710, 711; 365/200

[56] References Cited

U.S. PATENT DOCUMENTS

| | | | |
|---|---|---|---|
| 4,598,388 | 7/1986 | Anderson | 365/200 |
| 4,800,332 | 1/1989 | Hutchins | 324/73.1 |
| 4,816,757 | 3/1989 | Hutchins | 324/763 |
| 5,153,880 | 10/1992 | Owen et al. | 714/710 |
| 5,644,530 | 7/1997 | Gaultier | 365/185.09 |
| 5,768,196 | 6/1998 | Bloker et al. | 365/200 |
| 5,784,636 | 7/1998 | Rupp | 712/37 |
| 5,796,653 | 8/1998 | Gaultier | 365/185.09 |

*Primary Examiner*—Phung M. Chung

[57] ABSTRACT

A novel method and apparatus for automatically programming a redundancy map for a circuit is presented. A circuit comprising a plurality of identical reconfigurable circuit elements and a redundant circuit element includes a redundancy map register which may be programmed to allow faulty circuit elements to be deactivated and bypassed and the redundant circuit element to be activated. A fault detector tests the circuit to generate a fault indicator indicating which one of the reconfigurable circuit elements is a faulty circuit element. An encoder encodes the fault indicator into an encoded fault indicator. A decoder decodes the encoded fault indicator to generate a redundancy map for configuring the reconfigurable circuit elements.

17 Claims, 4 Drawing Sheets

METHOD FOR AUTOMATICALLY PROGRAMMING A REDUNDANCY MAP FOR A REDUNDANT CIRCUIT

FIELD OF THE INVENTION

The present invention pertains generally to electronic redundant circuits, and more particularly to a method for automatically programming the redundancy map for configuring the active elements of a redundant circuit.

BACKGROUND OF THE INVENTION

In the fabrication of electronic circuits, one technique utilized to increase production yield is to provide redundant circuit elements on the chip to allow for replacement of key circuit elements which prove to be defective. During testing of the chip, the defective portion of the circuit is identified and the redundant circuit element, if one exists, is activated by opening an associated fuse or similar mechanism.

Redundancy is especially suited for repetitive circuits having a large number of repeating elements arranged in some form of an array, such that one redundant circuit can replace a single defect in any of a large number of circuit elements. One such device is a semiconductor memory comprised primarily of memory cells. These memory cells are arranged in rows and columns wherein the redundant cell would be either a row of memory cells or a column of memory cells. If, for example, one cell in a given column was determined to be defective, this would classify the device as defective. This defective column could then be replaced by a redundant column and the device would be fully operational. A typical memory would have, for example, 256 rows and 256 columns. One redundant column would therefore be able to replace one of the 256 columns, thus constituting an efficient use of a redundant circuit.

One problem encountered in replacing a column or row in a semiconductor memory is maintaining address integrity; that is, the redundant column must have the same address as the defective column. This is normally implemented by providing a universal decode circuit in association with the redundant column circuitry. Appropriate fuses are included that can be opened to both activate the redundant column circuitry and also to program the universal decode circuitry for the appropriate address.

A redundant memory generally includes an array of memory cells arranged in rows and columns, each column of cells selected by a column address signal and each row of adjacent cells selected by a row address signal. A redundant column of memory elements is disposed adjacent the array and is selectable by a predetermined column address with the redundant column memory normally inactive. When a column of memory cells in the array is determined to be defective, this column is deactivated and a circuit is provided for activating the redundant column, such that it can be addressed by the predetermined column address. The addresses of the columns that are physically disposed between the defective column and the redundant column are reconfigured and incremented by one towards the defective column address.

Prior art universal decode circuitry for reconfiguring the addresses of the columns located between the defective column and redundant column typically includes a non-reconfigurable redundancy configuration circuit which is programmed once with a RAM redundancy map that is used to configure the active memory columns whenever the chip is powered up. During manufacturing test, the failing column must be identified, and the appropriate redundancy map stored in the redundancy configuration circuit. The redundancy configuration circuit is conventionally implemented with a bank of fuses, one per column that can be reconfigured. The corresponding fuse of each column whose address is to be reconfigured is broken in order to bypass the normal path to that column. Thus, during power up of the chip, a signal is fired which loads the redundancy map into redundancy registers that control the switches in the universal decode circuitry.

The conventional method for programming a RAM redundancy map requires off-line resources to program the redundancy configuration circuit (i.e., to break the fuses). This can be a time-consuming process that requires expensive equipment and/or costly technician time. In addition, because a single fuse is used for each reconfigurable column in memory, the number of fuses required to provide RAM redundancy may be quite large. Due to the sizes of the fuses, a high-density RAM may not be able to accommodate the number of required fuses in terms of space.

Accordingly, a need exists for a method for automatically programming a redundancy map for a RAM, and for redundant circuits in general, without the assistance of external resources. A need also exists for a method for reducing the size and cost of the redundancy configuration circuit.

SUMMARY OF THE INVENTION

The present invention is a novel method and apparatus for automatically programming the redundancy map for a redundant circuit. The method and apparatus of the invention operates automatically to allow on-chip hardware to reduce manufacturing test time and complexity. In addition, the technique of the invention reduces the number of fuses required to store the redundancy map and therefore cost of the chip.

In accordance with the invention, the redundancy map for a redundant circuit comprising a plurality of identical reconfigurable circuit elements and a redundant circuit element is automatically programmed. The redundant circuit elements are reconfigurable to be bypassed if faulty such that the faulty reconfigurable circuit element is deactivated and the redundant circuit element is utilized. A fault detector tests the redundant circuit to generate a fault indicator indicating which one of the reconfigurable circuit elements is a faulty circuit element. An encoder encodes the fault indicator into an encoded fault indicator. A decoder decodes the encoded fault indicator to generate a redundancy map for configuring the reconfigurable circuit elements.

In one embodiment, the apparatus of the invention includes a sticky compare register comprising a bit corresponding to each reconfigurable circuit element. A bit in the sticky compare register is only set if its corresponding column is determined to be faulty. The position of the bit corresponding to said faulty circuit element is encoded. One way of determining the position of the bit corresponding to the faulty circuit element is accomplished by counting the number of shifts required to shift the bit corresponding to said faulty circuit element to one end of said sticky compare register. The count value is the encoded fault indicator. The encoded fault indicator is stored in a non-volatile storage area, preferably a fuse register of size $\log_2(N+1)$, where N is the number of reconfigurable circuit elements. Upon power up of the chip, a bit value which causes the element to be deactivated (i.e., bypassed) is shifted a number of times equal to the stored count value into a redundancy map register and a bit value which causes the element to be activated is shifted into the redundancy map register for the remaining shifts cycles to pad out the rest of the redundancy map register.

In one embodiment, built-in self test (BIST) hardware is incorporated into the integrated circuit for exercising on-chip RAM. As data is read from the RAM array during BIST operation, each bit from the memory is compared to its expected value. If, in the bit-by-bit comparison of the output value with the expected value, a miscompare is observed, the bit in a sticky compare register corresponding to the column of the failed memory cell is set. The set bit is sticky, meaning that once it is set, it is not cleared until after the memory redundancy programming is complete. After the BIST test is complete, each set bit in the sticky compare register corresponds to a column in memory that has a failed cell. The contents of the sticky compare register are encoded by right shifting the sticky compare register until the first set bit is found. Each right shift cycle increments a counter. The count value contained in the counter after the first set bit is found is the encoded value, which is transferred to a fuse register and permanently programmed. At this time, or during subsequent power ups of the integrated circuit, the fuse register is referenced and a '1' is right shifted into a redundancy map register a number of times equal to the count value contained in the fuse register. A '0' is then right shifted into the redundancy map register until the total number of right shifts is equal to the number of reconfigurable columns (i.e., N-count value). In this manner, the redundancy map register contains a '0' for each RAM column to the left of the failing column, and a '1' for the failing column and each column to its right.

Accordingly, the invention automatically programs the redundancy map that repairs a redundant circuit without the need for external equipment.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A method and apparatus for automatically programming a redundancy map for a redundant circuit is described in detail hereinafter. For ease of understanding, the invention is discussed in the context of a redundant semiconductor memory. However, it will be appreciated by those skilled in the art that the inventive principles applied to a RAM memory array may be similarly applied to various other types of redundant circuits comprising a plurality of reconfigurable circuit elements with an available identical redundant circuit element.

Figure 1:
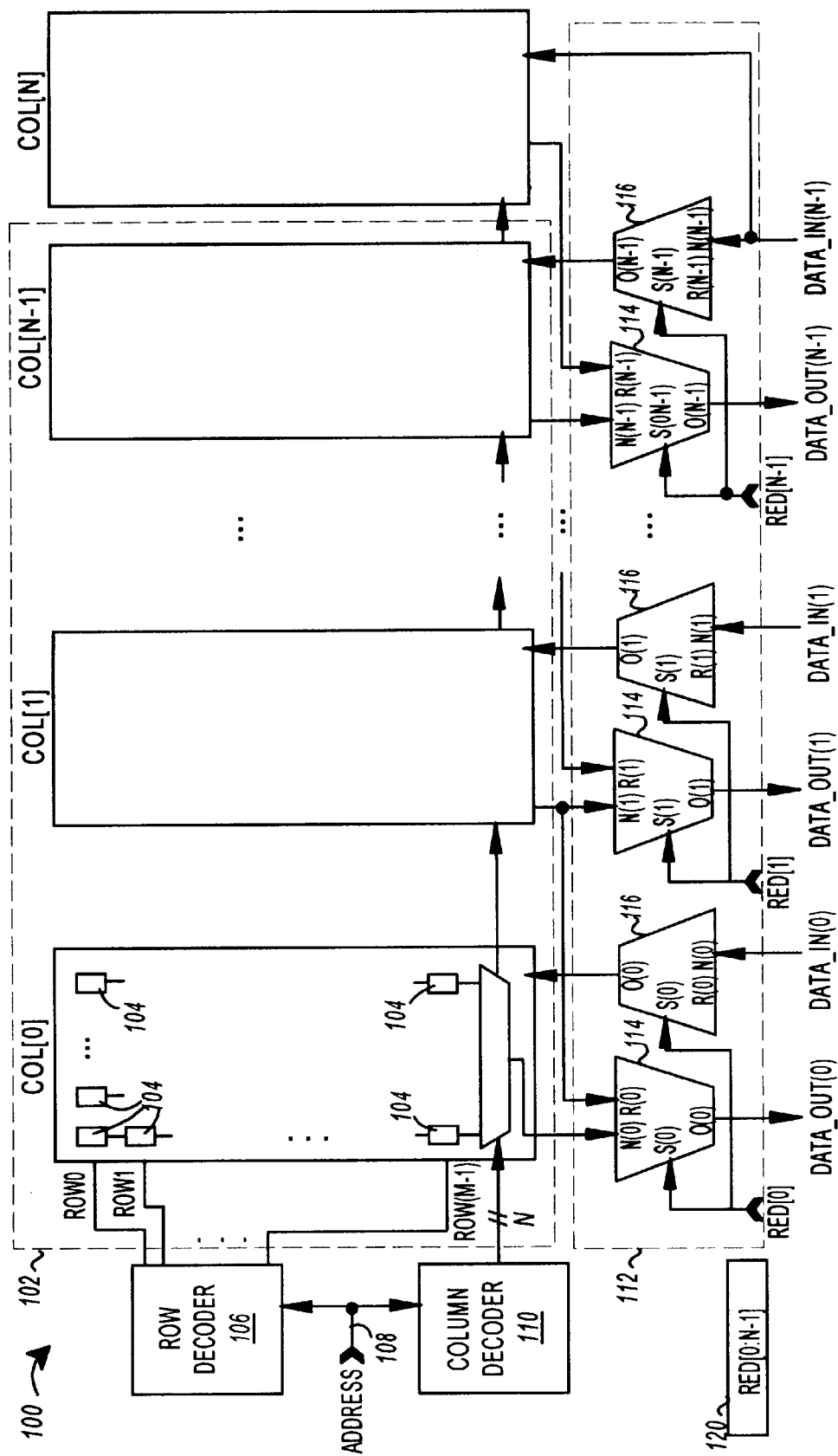
FIG. 1 is a schematic block diagram of a memory array with a redundant column.

Referring now to FIG. 1, there is illustrated a schematic block diagram of a memory 100 providing redundant circuitry. The memory 100 is comprised of an array 102 of memory cells 104 that may be arranged in any configuration, with the illustrative embodiment having the cells 104 arranged in an M-by-N array. Therefore, the memory array 102 has M rows and N columns with each cell 104 of the array 102 individually addressable for input and output therefrom.

In operation, an address 108 is input to a row decoder 106 and one of M rows ROW[0], . . . , ROW[M] is activated. Similarly, the address 108 is input to a column decoder 110 and one of N columns COL[0], . . . ,COL[N-1] activated in accordance with known principles in response to receiving the address 108. A redundant column COL[N] is implemented adjacent to the N-1$^{th}$ column of memory array 102. Redundancy configuration circuitry 112 configures the active columns COL[0], . . . ,COL[N-1] of the memory array 102. In particular, redundancy configuration circuitry 112 comprises a bank of output switches 114 and a bank of input switches 116. Each output switch 114 has two switched inputs—a normal input N(K) and a redundant input R(K)—and a common output O(K). Normal input N(K) is coupled to the output of its corresponding column COL(K) while redundant input R(K) is coupled to the output of the column COL(K+1) to its right. Each output switch 114 has a select input S(K) that is responsive to select one or the other of inputs N(K) or R(K) to couple to the output O(K). The select input S(K) of switches 114 are each respectively coupled to a corresponding redundancy map bit RED(K). The redundancy map bits R(K) are stored in a redundancy map register 120, denoted RED[0:N-1], which contains a redundancy map bit RED(K) corresponding to each of columns COL[0:N-1]. By setting the state of the output switch 114, via coupling the select input S(K) to its corresponding bit RED(K) in redundancy register RED[0:N-1], the actual output signal DATA_OUT[K] from the switch 114 can be altered by shifting the column that sources the actual data DATA_OUT[K] by one. The redundancy bit RED[K] is set to a 0 for all the columns COL[K] starting at the left (K=0) up until the column that has the failure. The redundancy bit RED[K] for the column that has the failure is set to a 1. For example, if COL[1] is determined to be defective, redundancy bit RED[0] is set to a "0", indicating that the data output DATA_OUT[0] is to be sourced through normal decode output N_OUT[0], and redundancy bits RED[1:N-1] are each set to a "1", indicating that the data output DATA_OUT[1:N-1] is to be sourced through redundant decode output R_OUT[2:N]. Accordingly, the source data of each output data DATA_OUT[1:N-1] comes from the column shifted to the right, that is COL[2:N].

In other words, in a memory array 102 with no defects, all output data DATA_OUT[0:N-1] is sourced through its corresponding switch's 114 normal decode output N_OUT[0:N-1]. However, if a column is defective, the output data DATA_OUT[K] for the defective column and each column to the right of the defective column is sourced through its corresponding switch's redundancy decode output RED[K]. Accordingly, if one of the columns COL[0:N-1] are defective, the source of data for the last data output bit DATA_OUT[N-1] is from redundancy RAM column COL[N].

Input switches 116 operate similarly, but selectively switch between a normal data input signal DATA_IN(K) received on input N(K) and redundant signal DATA_IN(K+1) received on redundancy input R(K). The redundancy input R(0) of the left-most switch 116 is tied to a reference signal, for example the circuit ground. Input switches 116 are responsive via their select inputs S(K) to the value of their corresponding bits in redundancy register RED[0:N-1].

To permanently store the redundancy map for use at a later power up of the chip, each of the bits of redundancy map register 120 is coupled to the input of a non-volatile storage 122. Redundancy bits RED[0:N-1] are stored in a non-volatile storage 122. At power up, the bit values RED [0:N-1] in the redundancy map register 120 are used as select inputs to their corresponding bit data output switches 114. Accordingly, bit RED[0] is used as a select input for switch 114 that outputs DATA_OUT[0], bit RED[1] is used as a select input for switch 114 that outputs DATA_OUT[1], and so on.

Figure 2A:
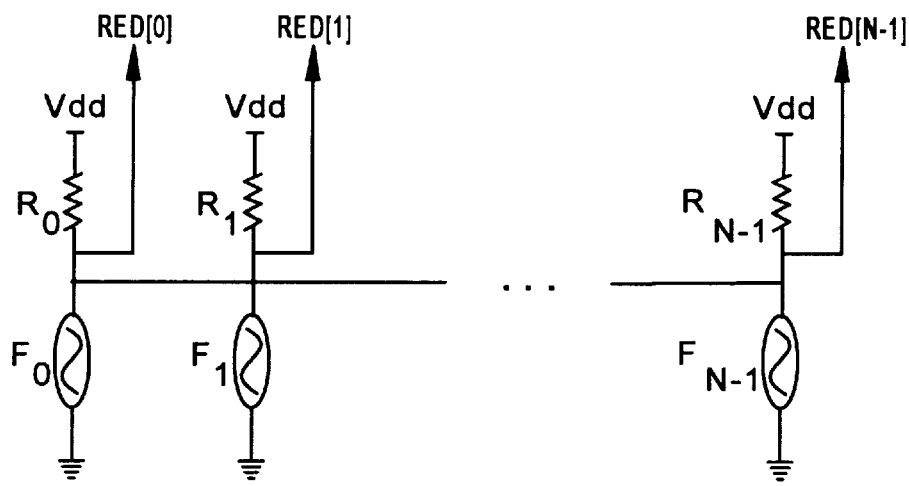
FIG. 2(a) is a schematic diagram of a first embodiment of a prior art non-volatile storage circuit.
Figure 2B:
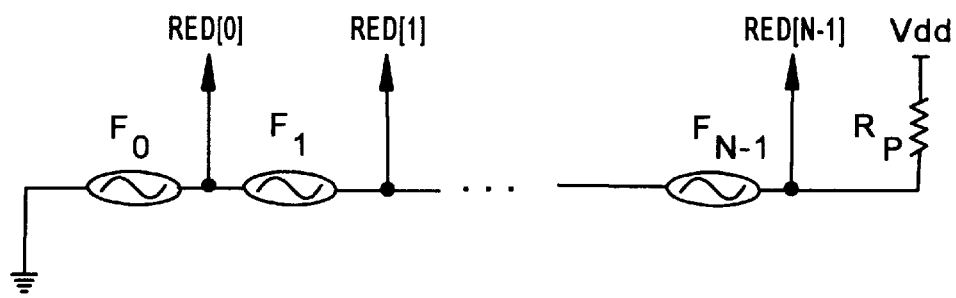
FIG. 2(b) is a schematic diagram of a second embodiment of a prior art non-volatile storage circuit.

FIGS. 2(a) and 2(b) illustrate alternative conventional prior art nonvolatile storage circuits 200 and 250 used to implement non-volatile storage 122. In the embodiment shown in FIG. 2(b), non-volatile storage circuit 200 comprises a pullup resistor $R_0, R_1, \ldots, R_N$ respectively coupled between a power source Vdd and a corresponding redundancy bit RED[0:N-1] in redundancy map register 120, which are each coupled respectively via a fusable link $F_0$, $F_1, \ldots, F_N$ to ground. In a normal memory configuration, each fuse provides a low impedance path to ground, so its respective redundancy bit is 0. If a column is defective, its corresponding fuse, and the fuse of each column to the right of the defective column, is blown, thereby breaking the low impedance path to ground, and the corresponding redundancy bit is pulled high through its respective pull-up resistor R.

In the embodiment shown in FIG. 2(b), non-volatile storage circuit 250 includes fusable links $F_0, F_1, \ldots, F_N$ coupled in series, as illustrated, between ground and a single pullup resistor $R_P$ to power source $V_{dd}$. Circuit 250 has the advantage over circuit 200 in that it requires only one (versus N-1) pullup resistors. Additionally, it requires only one fuse (i.e., the fuse $F_K$ corresponding to the faulty column COL[K]) to be blown.

Figure 3:
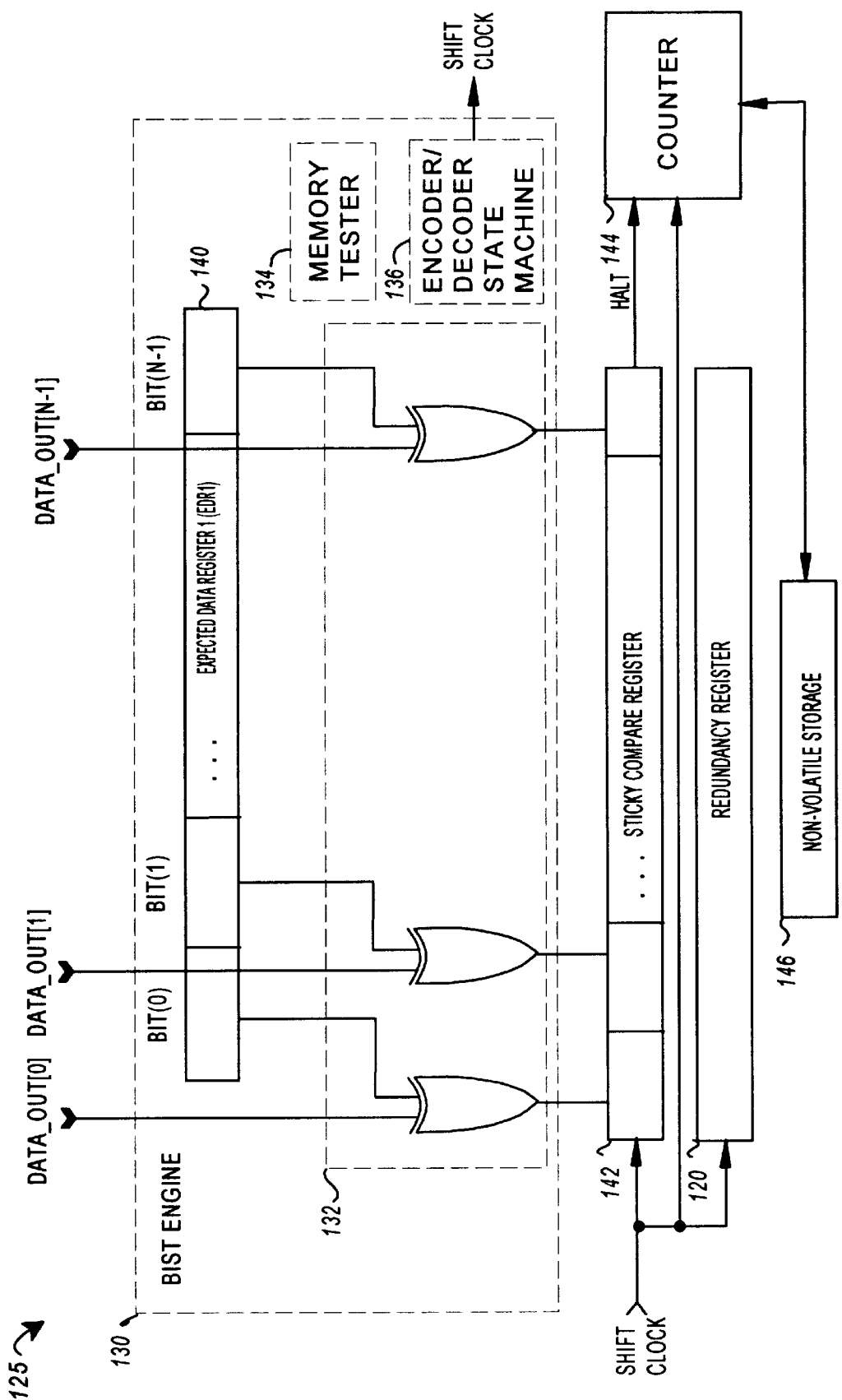
FIG. 3 is a schematic block diagram of a circuit in accordance with the invention for automatically programming the redundancy configuration.

FIG. 3 is a schematic block diagram of a circuit in accordance with the invention for automatically programming the redundancy configuration. Integrated circuit (IC) 125 includes built-in self test (BIST) engine 130 which tests memory array 102 for faults. BIST engine 130 is hardware, firmware, or a combination of both, that controls the execution of on-chip memory tests that are designed to detect and locate failures in cells 104 of memory array 102. BIST engine 130 generates test patterns and corresponding expected output data for memory 100. A comparator 132 residing within IC 125 compares the output data DATA_OUT[0:N-1] with the expected data value present in expected data register 140. A mismatch between a bit value of the output data DATA_OUT[0:N-1] and the corresponding bit value 0:N-1 of expected value register 140 indicates a cell failure in the column COL[0:N-1] of memory array 102 that is associated with that particular bit.

If comparator 132 detects a bit mismatch, the corresponding bit in sticky compare register 142, which also corresponds to the column in memory array 102 that generated the mismatch, is set to a "1". Sticky compare register 142 is "sticky", meaning that once a bit is set to a "1", it will remain set until completion of the redundancy configuration programming. Upon completion of the BIST test, each "1" in sticky compare register 142 corresponds to a column in memory array 102 that contains a failed cell 104.

The contents of sticky compare register 142 are encoded and stored in non-volatile storage 146 for later decoding into the RAM redundancy map. To encode the contents of the sticky compare register 142, the contents of sticky compare register 142 are right-shifted and a counter 144, initialized to zero, incremented once per shift cycle, until the right-most bit of sticky compare register 142 contains a 1, or until N shift cycles have completed, whichever occurs first. The contents of the counter 144 contain the encoded RAM redundancy map value $MAP_{en}[0:\log_2(N+1)]$, which may be decoded as discussed hereinafter and loaded into non-volatile storage 146. In the preferred embodiment, the non-volatile storage 146 is a fuse register of size $\log_2(N+1)$ fuses, which, as appreciated by those skilled in the art, is a significant reduction in number of required fuses.

The redundancy map of memory array 102 is automatically programmed during initialization of the chip upon power up by decoding the encoded redundancy map value $MAP_{en}[0:\log_2(N+1)]$ contained in the nonvolatile storage 146 and placing the decoded RAM redundancy map in redundancy register 120. In the preferred embodiment, the RAM redundancy map is decoded and constructed from the contents of the fuse register 146 by right-shifting a "1" into redundancy register 120 for a number of shift cycles equal to the encoded redundancy map value $MAP_{en}[0:\log_2(N+1)]$ contained in the fuse register 146, and then right-shifting in a "0" into redundancy register 120 for the remaining N-count value cycles for a total number of right-shift cycles equal to the number of reconfigurable columns N. Once the decoding process is complete, redundancy register 120 contains the appropriate RAM redundancy map for correcting memory array 102.

As an illustration, suppose that memory array 102 comprises columns COL[0:7] and COL[1] is determined to be the only defective column. At the end of the BIST test sticky compare register 142 will contain a "1" in the bit corresponding to column COL[1]. Sticky compare register 142 will be right-shifted until the "1" is encountered; thus, counter 144 will contain a count equal to six (0110 binary), which is encoded into four ($\log_2(8)$) fuses. Whenever the chip is powered up in the future, the value six is read from non-volatile storage 146 and a "1" is right-shifted into redundancy register 120 six times followed by two "0"s for a total of eight shifts. At this point, redundancy register 120 is programmed and memory array 102 is configured to utilize redundant column COL[N] if necessary to correct for any memory failures.

Figure 4:
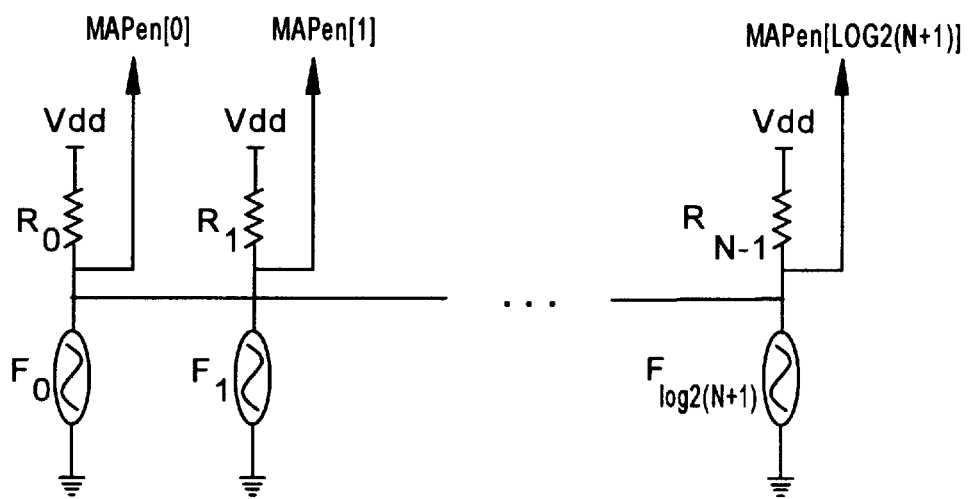
FIG. 4 is a schematic diagram of one embodiment of a non-volatile storage circuit in accordance with the invention.

FIG. 4 illustrates one embodiment of non-volatile storage 146 in accordance with the invention. As shown, because the redundancy map value has been encoded to the positional count value $MAP_{en}[0:\log_2(N+1)]$ of the faulty circuit element, only $\log_2(N+1)$ fuses are required.

Figure 5:
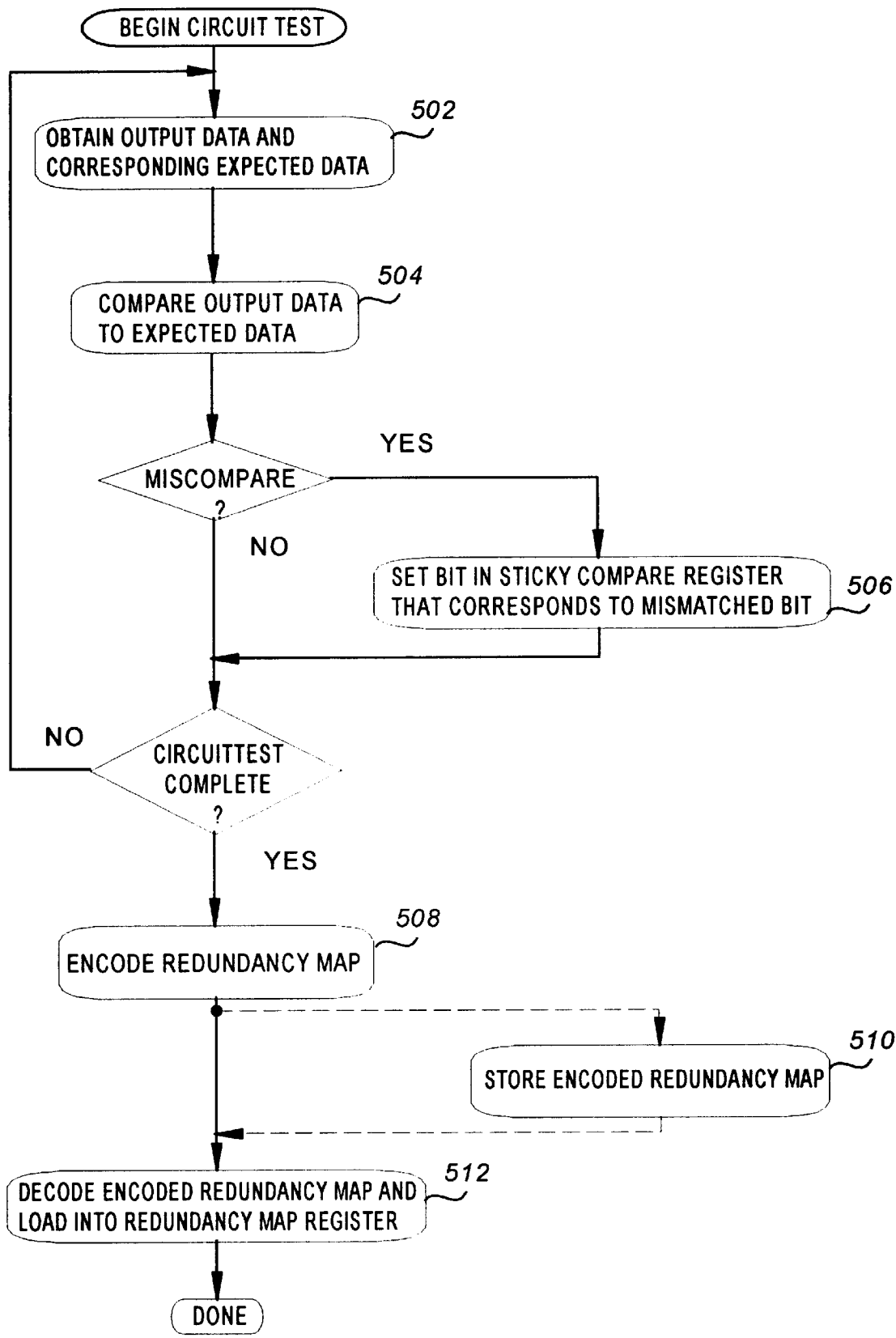
FIG. 5 is a flowchart of a method in accordance with the invention.

FIG. 5 is a flowchart of the method of the invention for automatically determining and programming the redundancy map. In a first step 502, BIST hardware obtains data output read out of the array on DATA_OUT[0:N-1] lines and corresponding expected output data for those lines. Each bit DATA_OUT[0:N-1] from the memory is compared to its expected value in step 504. If a miscompare in one or more of the output data bits DATA_OUT[0:N-1] is observed, its corresponding bit in a sticky compare register is set to a "1" in step 506. The bit is termed "sticky" because once it is set during a BIST test, it remains set until after redundancy programming is complete. Steps 502 through 506 are repeated until the BIST test completes. Upon completion of the BIST test, each bit in the sticky compare register that is set to a "1" indicates that its corresponding column contains a failure. In step 508, the RAM redundancy map is encoded. In the preferred embodiment, this is accomplished by executing an "encode fuse" instruction, which causes the sticky compare register to be right-shifted until the first "1" is found. Each right shift increments a counter. The value in the counter after the right-shifting is complete is the encoded redundancy map. In step 510, the encoded redundancy map is optionally stored in a fuse register of $\log_2(N+1)$ in length. Once written to the fuse register, the redundancy map cannot be changed. During initialization of the chip, or directly after the encoded redundancy map is generated, the encoded redundancy map is decoded and loaded into the redundancy register in step 512. The value of each redundancy bit RED[0:N-1] are used as the select signal for its corresponding output switch 114 and input switch 116 in the redundancy configuration circuit 112. In the preferred embodiment, the fuse register is decoded by executing a "decode fuse" instruction, which causes the redundancy register 120 to be right-shifted a number of times equal to the encoded redundancy map value $MAP_{en}[0:\log_2(N+1)]$ stored in the fuse register, shifting a "1" in with each right-shift. A "0" is then right-shifted into the redundancy register until the redundancy register has been right-shifted by a total of N times. In this manner, the redundancy register has "0"s for each column to the left of the failing column and "1"s for the failing column and each column to its right. Accordingly, the memory array is automatically repaired at power up.

As mentioned previously, the encoded redundancy map value $MAP_{en}[0:\log_2(N+1)]$ need not be stored permanently. Instead, the BIST test that locates the failed circuit element may be executed each time upon power up of the chip and the encoded redundancy map value $MAP_{en}[0:\log_2(N+1)]$ decoded directly and stored in the redundancy map register.

Although the illustrative embodiment discussed herein has been in the context of a semiconductor memory array, those skilled in the art will appreciate that the inventive principles extend to any circuit that comprises a number of reconfigurable circuit elements and a redundant identical circuit element.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An apparatus for automatically programming a redundancy map for a circuit, said circuit comprising a plurality of identical reconfigurable circuit elements and a redundant circuit element, said reconfigurable circuit elements being reconfigurable to be bypassed if faulty such that said redundant circuit element is utilized in place of said faulty reconfigurable circuit element, said redundant circuit element being identical to each of said plurality of reconfigurable circuit elements, comprising:
    an encoder responsive to a fault indicator which encodes said fault indicator into an encoded fault indicator, said fault indicator indicating which one of said plurality of reconfigurable circuit elements is a faulty circuit element;
    a decoder which decodes said encoded fault indicator to generate said redundancy map for configuring said plurality of reconfigurable circuit elements.

2. An apparatus in accordance with claim 1, wherein said fault indicator comprises:
    a sticky compare register comprising a plurality of sticky compare register bits, comprising a bit corresponding to each of said reconfigurable circuit elements, wherein one of said plurality of sticky compare register bits corresponds to said faulty circuit element and has a value indicating that said faulty circuit element is faulty.

3. An apparatus in accordance with claim 2, wherein said encoded fault indicator comprises:
    the position of said bit corresponding to said faulty circuit element.

4. An apparatus in accordance with claim 3, wherein said encoder comprises:
    a counter which counts a number of shifts required to shift said bit corresponding to said faulty circuit element to one end of said sticky compare register to generate said encoded fault indicator.

5. An apparatus in accordance with claim 1, comprising:
    a redundancy map register comprising a plurality of redundancy map bits, each redundancy map bit corresponding to one of said reconfigurable circuit elements;
    shifting means for shifting a bypass bit value into said redundancy map register a first number of shifts equal to said encoded fault indicator and a non-bypass bit value into said redundancy map register a second number of shifts equal to the number of said plurality of reconfigurable circuit elements less said first number of shifts.

6. An apparatus in accordance with claim 1, comprising:
    a non-volatile storage device which stores said encoded fault indicator when said circuit is powered down.

7. An apparatus in accordance with claim 6, wherein said non-volatile storage device comprises:
    a plurality of fuses, said plurality of fuses equal in number to $\log_2(N+1)$, where N is the number of said plurality of reconfigurable circuit elements.

8. An apparatus in accordance with claim 1, comprising:
    a fault detector which identifies faults in said plurality of reconfigurable circuit elements and produces said fault indicator indicating which one of said plurality of reconfigurable circuit elements is said faulty circuit element.

9. An apparatus in accordance with claim 8, wherein said fault detector comprises:
    a built-in self test engine which performs comparisons between output data read from said reconfigurable circuit elements and expected values for said output data read from said reconfigurable circuit elements to determine which one, if any, of said plurality of reconfigurable circuit elements is faulty.

10. A method for automatically programming a redundancy map for configuring a circuit, said circuit comprising a plurality of identical reconfigurable circuit elements and a redundant circuit element, said reconfigurable circuit elements being reconfigurable to be bypassed if faulty such that said redundant circuit element is utilized in place of said faulty reconfigurable circuit element, said redundant circuit element being identical to each of said plurality of reconfigurable circuit elements, said method comprising:
    receiving a fault indicator, said fault indicator indicating which one of said plurality of reconfigurable circuit elements is said faulty redundant circuit element;
    encoding said fault indicator into an encoded fault indicator; and
    decoding said encoded fault indicator to generate a redundancy map for configuring said plurality of reconfigurable circuit elements.

11. A method in accordance with claim 10, wherein said fault indicator comprises:

a sticky compare register comprising a plurality of sticky compare register bits, comprising a bit corresponding to each of said reconfigurable circuit elements, wherein one of said plurality of sticky compare register bits corresponds to said faulty reconfigurable circuit element and has a value indicating that said faulty reconfigurable circuit element is faulty.

12. A method in accordance with claim 11, wherein said encoding step comprises:

encoding said fault indicator to the position of said bit corresponding to said faulty reconfigurable circuit element.

13. A method in accordance with claim 12, wherein said encoding step comprises:

shifting said bit corresponding to said faulty reconfigurable circuit element to one end of said sticky compare register;

maintaining a count of said number of shifts required to shift said bit corresponding to said faulty reconfigurable circuit element to said one end of said sticky compare register; and encoding said count as said encoded fault indicator.

14. A method in accordance with claim 13, wherein said decoding step comprises:

shifting a bypass bit value into a redundancy map register a first number of shifts equal to said encoded fault indicator and a non-bypass bit value into said redundancy map register a second number of shifts equal to the number of said plurality of reconfigurable circuit elements less said first number of shifts.

15. A method in accordance with claim 1 0, comprising:

storing said encoded fault indicator in a non-volatile storage area which stores said encoded fault indicator when said circuit is powered down.

16. A method in accordance with claim 10, comprising:

testing said circuit to identify said faults in said plurality of reconfigurable circuit elements to produce said fault indicator indicating which one of said plurality of reconfigurable circuit elements is said faulty reconfigurable circuit element.

17. A method in accordance with claim 16, wherein said testing step comprises:

performing comparisons between output data read from said reconfigurable circuit elements and expected values for said output data read from said reconfigurable circuit elements to determine which one, if any, of said plurality of reconfigurable circuit elements is faulty.

\* \* \* \* \*